(12) United States Patent
Harel et al.

(10) Patent No.: US 7,965,987 B2
(45) Date of Patent: Jun. 21, 2011

(54) AMPLIFYING A TRANSMIT SIGNAL USING A FRACTIONAL POWER AMPLIFIER

(75) Inventors: Haim Harel, New York, NY (US); Yair Karmi, Bridgewater, NJ (US)

(73) Assignee: Magnolia Broadband Inc., Warren, NJ (US)

( * ) Notice: Subject to any disclaimer, the term of this patent is extended or adjusted under 35 U.S.C. 154(b) by 427 days.

(21) Appl. No.: 11/268,260

(22) Filed: Nov. 3, 2005

(65) Prior Publication Data
US 2007/0218849 A1 Sep. 20, 2007

(51) Int. Cl.
*H04B 1/00* (2006.01)
*H04B 7/00* (2006.01)

(52) U.S. Cl. ....... 455/69; 455/101; 455/103; 455/127.1; 455/522

(58) Field of Classification Search .... 455/127.1–127.5, 455/522, 69, 101, 103, 105, 114.2; 330/51, 330/149
See application file for complete search history.

(56) References Cited

U.S. PATENT DOCUMENTS

| | | | |
|---|---|---|---|
| 5,642,353 A | 6/1997 | Roy, III et al. | |
| 5,832,044 A | 11/1998 | Sousa et al. | |
| 5,862,461 A * | 1/1999 | Yoshizawa et al. | 455/127.3 |
| 5,991,330 A | 11/1999 | Dahlman et al. | |
| 5,999,826 A | 12/1999 | Whinnett | |
| 6,151,328 A | 11/2000 | Kwon et al. | 370/441 |
| 6,185,440 B1 | 2/2001 | Barratt et al. | |
| 6,226,509 B1 | 5/2001 | Mole et al. | |
| 6,236,363 B1 | 5/2001 | Robbins et al. | |
| 6,330,294 B1 | 12/2001 | Ansbro et al. | |
| 6,343,218 B1 | 1/2002 | Kaneda et al. | |
| 6,392,988 B1 | 5/2002 | Allpress et al. | |
| 6,397,090 B1 * | 5/2002 | Cho | 455/574 |
| 6,492,942 B1 | 12/2002 | Kezys | |
| 6,636,495 B1 | 10/2003 | Tangemann | |
| 6,704,370 B1 | 3/2004 | Chheda et al. | |
| 6,745,009 B2 | 6/2004 | Raghothaman | |
| 6,810,264 B1 | 10/2004 | Park et al. | |
| 6,859,643 B1 * | 2/2005 | Ma et al. | 455/101 |
| 6,882,228 B2 | 4/2005 | Rofougaran | 330/301 |
| 7,209,720 B2 * | 4/2007 | Balasubramaniyan et al. | 455/127.5 |

(Continued)

FOREIGN PATENT DOCUMENTS
EP 0 986 193 3/2000
(Continued)

OTHER PUBLICATIONS

Derryberry at al., "Transmit Diversity in 3G CDMA Systems", Wideband Wireless Access Technologies to Broadband Internet, IEEE Communications Magazine, Apr. 2002, pp. 68-75.

(Continued)

*Primary Examiner* — Edward Urban
*Assistant Examiner* — RuiMeng Hu
(74) *Attorney, Agent, or Firm* — Pearl Cohen Zedek Latzer, LLP

(57) ABSTRACT

A transmit amplifier stage operable to amplify a transmit signal comprises power amplifiers and switches. The power amplifiers include at least one full power amplifier operable to provide full power to amplify the transmit signal and at least one fractional power amplifier operable to provide fractional power to amplify the transmit signal, where the fractional power is a fraction of the full power. A switch has a plurality of positions, where a position directs the transmit signal to a selected power amplifier.

41 Claims, 2 Drawing Sheets

U.S. PATENT DOCUMENTS

| | | | |
|---|---|---|---|
| 2003/0002594 A1* | 1/2003 | Harel et al. | 375/299 |
| 2003/0112880 A1 | 6/2003 | Walton et al. | |
| 2004/0048584 A1 | 3/2004 | Vaidyanathan et al. | |
| 2004/0085239 A1 | 5/2004 | Ukena et al. | |
| 2005/0059355 A1 | 3/2005 | Liu | |
| 2005/0143024 A1 | 6/2005 | Sung et al. | 455/101 |
| 2005/0143113 A1 | 6/2005 | Lee et al. | |
| 2006/0267682 A1* | 11/2006 | Grebennikov | 330/51 |

FOREIGN PATENT DOCUMENTS

| | | |
|---|---|---|
| EP | 1 191 707 A1 | 3/2002 |
| EP | 1 282 242 | 2/2003 |
| EP | 1 282 244 | 2/2003 |
| EP | 1 284 545 | 2/2003 |
| EP | 1 262 031 | 5/2004 |
| GB | 2 353 437 | 2/2001 |
| JP | 09-238098 | 9/1997 |
| JP | 2000-151484 | 5/2000 |
| WO | WO 97/24818 | 7/1997 |
| WO | WO 00/79701 | 12/2000 |
| WO | WO 01/69814 | 9/2001 |
| WO | WO 03/090378 A1 | 10/2003 |
| WO | WO 03/090386 | 10/2003 |
| WO | WO 2004/045108 | 5/2004 |
| WO | WO 2005/081444 | 9/2005 |

OTHER PUBLICATIONS

Rashid-Farrokhi, et al., "Transmit Beamforming and Power Control for Cellular Wireless Systems", IEEE Journal on Selected Areas in Communications, vol. 16, No. 8, Oct. 1998, pp. 1437-1450.

* cited by examiner

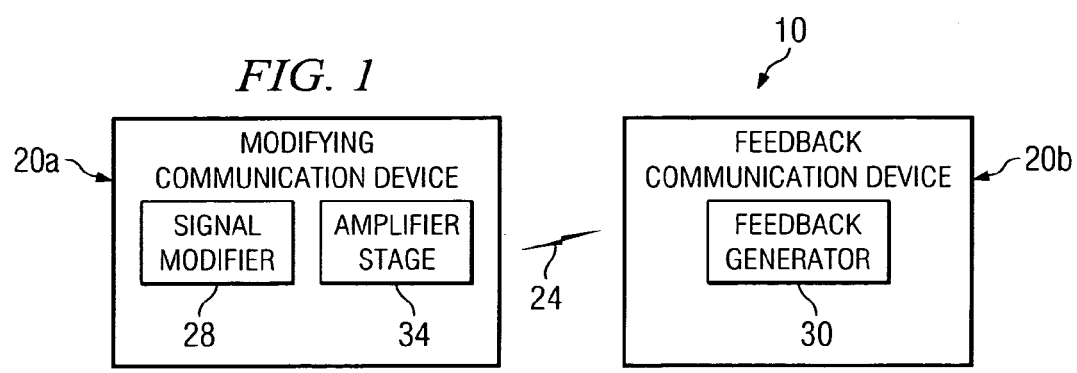
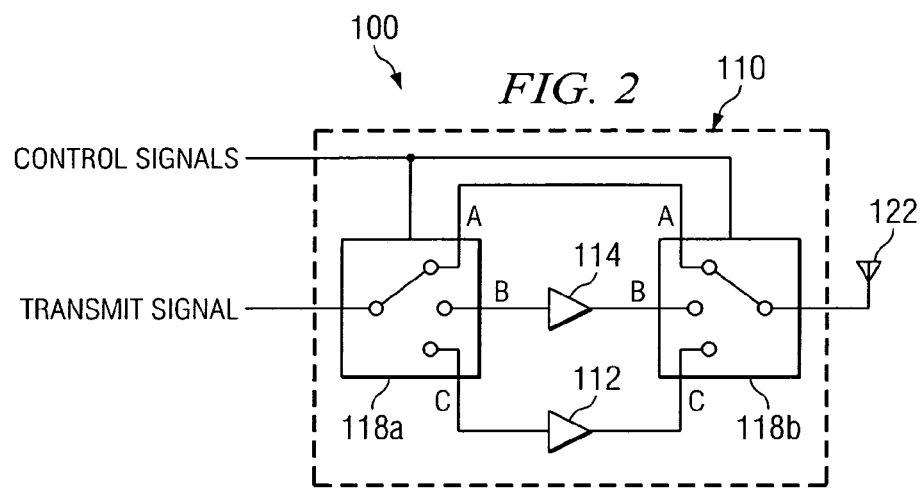
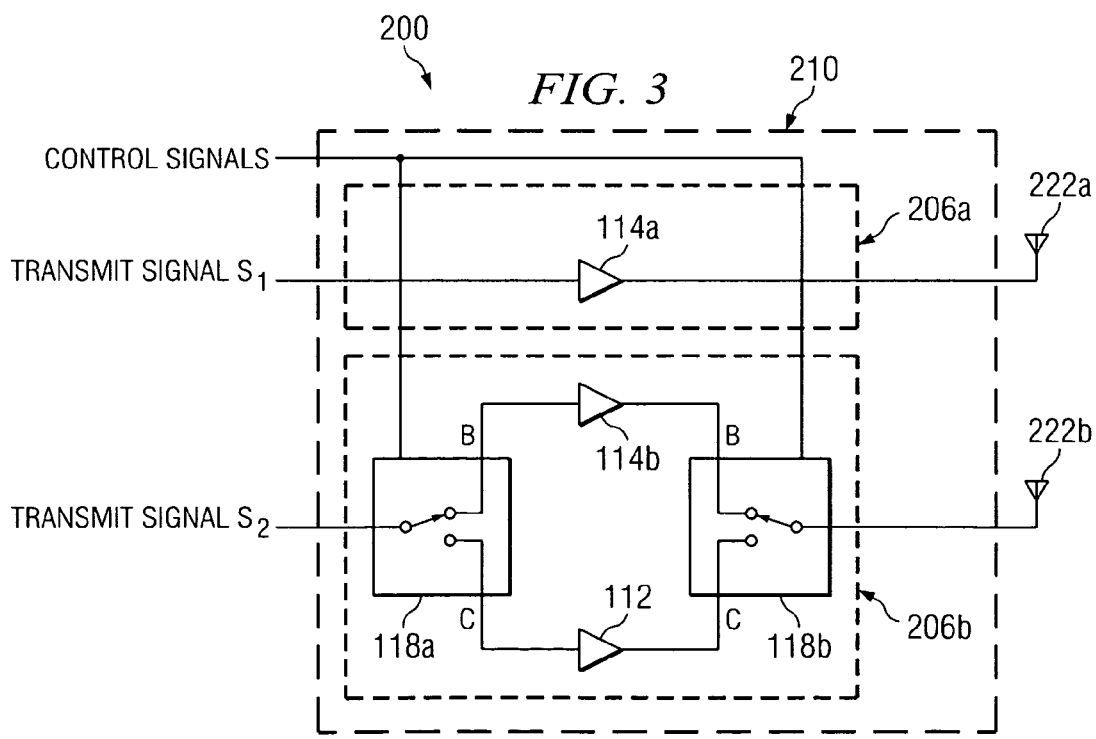

AMPLIFYING A TRANSMIT SIGNAL USING A FRACTIONAL POWER AMPLIFIER

TECHNICAL FIELD

This invention relates generally to the field of wireless communications and more specifically to amplifying a transmit signal using a fractional power amplifier.

BACKGROUND

A transmitting communication device may have multiple antenna elements that transmit signals to communicate information. A receiving communication device extracts the information from the transmitted signals. Multiple antenna elements may enhance spectral efficiency, allowing for more users to be simultaneously served over a given frequency band. Amplifying the signals for transmission, however, may burden the power source of the transmitting communication device. It is generally desirable to reduce the burden on the power source.

SUMMARY OF THE DISCLOSURE

In accordance with the present invention, disadvantages and problems associated with previous techniques for amplifying signals may be reduced or eliminated.

According to one embodiment of the present invention, a transmit amplifier stage operable to amplify a transmit signal comprises power amplifiers and switches. The power amplifiers include at least one full power amplifier operable to provide full power to amplify the transmit signal and at least one fractional power amplifier operable to provide fractional power to amplify the transmit signal, where the fractional power is a fraction of the full power. A switch has a plurality of positions, where a position directs the transmit signal to a selected power amplifier.

Certain embodiments of the invention may provide one or more technical advantages. A technical advantage of one embodiment may be that a transmit amplifier stage includes a full power amplifier and a fractional power amplifier. The fractional power amplifier may be selected to amplify a transmit signal using a fractional power. The fractional power amplifier typically consumes less power than the full power amplifier, so the power consumption may be decreased. Another technical advantage of one embodiment may be that the amplifier stage may be used to amplify multiple transmit signals to be transmitted from multiple antennas. The multiple transmit signals may be used to perform a diversity control operation, which may compensate for multipath fading and suppress interference signals.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1 is a block diagram illustrating a communication network that includes a modifying communication device comprising one embodiment of an amplifier stage operable to amplify a signal;

FIG. 2 is a block diagram illustrating one embodiment of a transmitter output stage that includes an amplifier stage operable to amplify a signal;

FIG. 3 is a block diagram illustrating one embodiment of a transmitter output stage that includes an amplifier stage operable to amplify a plurality of signals;

DETAILED DESCRIPTION OF THE DRAWINGS

Figure 4:
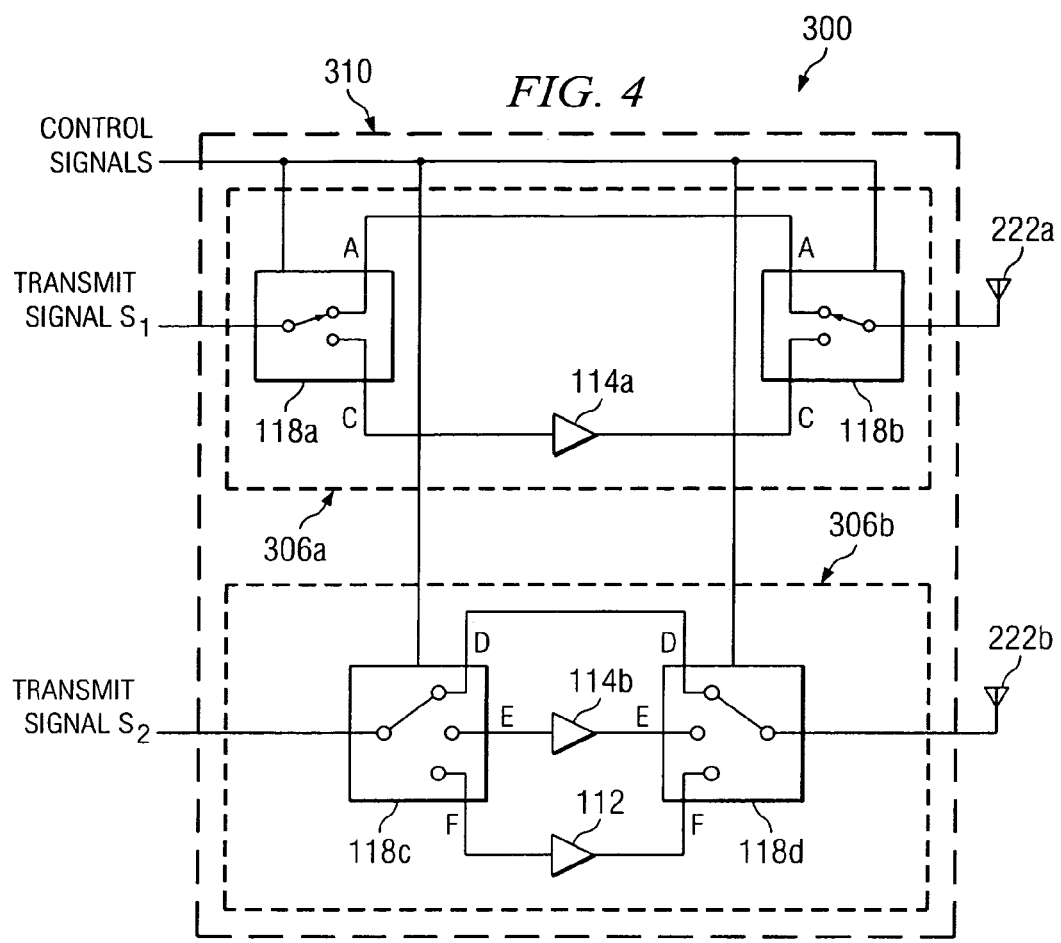
FIG. 4 is a block diagram illustrating another embodiment of a transmitter output stage that includes an amplifier stage operable to amplify a plurality of signals.

Embodiments of the present invention and its advantages are best understood by referring to FIGS. 1 through 5 of the drawings, like numerals being used for like and corresponding parts of the various drawings.

FIG. 1 is a block diagram illustrating a communication network 10 that includes a modifying communication device 20*a* comprising one embodiment of an amplifier stage 34. Amplifier stage 34 includes a full power amplifier and a fractional power amplifier. The fractional power amplifier may be selected to amplify a transmit signal using a fractional power. The fractional power amplifier typically consumes less power than the full power amplifier, so the power consumption may be decreased.

According to one embodiment of operation, modifying communication device 20*a* may implement a diversity control operation. Modifying communication device 20*a* applies a diversity parameter adjustment to a signal transmitted to feedback communication device 20*b*. Feedback communication device 20*b* returns feedback information that describes the signal as received by feedback communication device 20*b*. Modifying communication device 20*a* determines a next diversity parameter adjustment in accordance with the feedback information. The diversity control operation may compensate for multipath fading and suppress interference signals.

According to the illustrated embodiment, network 10 operates to provide services such as communication sessions. A communication session may refer to an active communication between endpoints, measured from endpoint to endpoint. Information is communicated during a communication session. Information may refer to voice, data, text, audio, video, multimedia, control, signaling, other information, or any combination of the preceding.

The information may be communicated in packets. A packet may comprise a bundle of data organized in a specific way for transmission, and a frame may comprise the payload of one or more packets organized in a specific way for transmission. A packet-based communication protocol such as the Internet Protocol (IP) may be used to communicate the packets. A packet may comprise any suitable packet, such as a General Packet Radio Service (GPRS) packet, an Enhanced Data for GSM Evolutions (EDGE) packet, or other suitable packet.

Network 10 may utilize communication protocols and technologies to provide the communication sessions. Example communication protocols and technologies include those set by the Institute of Electrical and Electronics Engineers, Inc. (IEEE) 802.xx, International Telecommunications Union (ITU-T) standards (for example, the IMT-2000 standards), European Telecommunications Standards Institute (ETSI) standards (for example, the HIPERLAN and HIPER- LAN2 local area network standards), Internet Engineering Task Force (IETF) standards, Third Generation Partnership Project (3GPP) or 3GPP2 standards, or other standards.

Devices of network 10 may use any suitable access technology, for example, the frequency division duplex (FDD), time division duplex (TDD), code division multiple access (CDMA), or orthogonal frequency division multiplex (OFDM) technology. According to one embodiment, network 10 may operate according to a CDMA 2000 telecommunications technology that uses a single CDMA channel. As an example, a CDMA 2000 high rate data packet technology, such as the Evolution Data Only (EvDO) technology may be used.

Network 10 may comprise any suitable communication network. A communication network may comprise all or a portion of a public switched telephone network (PSTN), a public or private data network, a local area network (LAN), a metropolitan area network (MAN), a wide area network (WAN), a wireline or wireless network, a local, regional, or global communication network (such as the Internet), an enterprise intranet, other suitable communication link, or any combination of the preceding.

Network 10 includes one or more modifying communication devices 20a and one or more feedback communication devices 20b that communicate via a wireless link 24. A communication device 20 represents any device operable to communicate information via signals with one or more other communication devices 20. For example, communication device 20 may comprise a subscriber unit or a base station. A subscriber unit may comprise any device operable to communicate with a base station, for example, a personal digital assistant, a cellular telephone, a mobile handset, a computer, or any other device suitable for communicating signals to and from a base station. A subscriber unit may support, for example, Session Initiation Protocol (SIP) or any other suitable communication protocol.

A base station provides a subscriber unit access to a communication network that allows the subscriber unit to communicate with other networks or devices. A base station typically includes a base transceiver station and a base station controller. The base transceiver station communicates signals to and from one or more subscriber units. The base station controller manages the operation of the base transceiver station.

A communication device 20 may include one or more antenna elements, where each antenna element is operable to receive, transmit, or both receive and transmit a signal. Multiple antenna elements may provide for a separation process known as spatial filtering, which may enhance spectral efficiency, allowing for more users to be served simultaneously over a given frequency band. Wireless link 24 between communication devices 20a and 20b may be a radio frequency link used to communicate a signal between communication devices 20a and 20b.

Modifying communication device 20a includes a signal modifier 28 that modifies one or more signals in accordance with feedback information received from feedback communication device 20b. According to one embodiment, modifying a signal may be described as applying a diversity parameter adjustment. A diversity parameter represents a feature of a signal that may be modulated, for example, relative phase, relative amplitude, absolute power, frequency, timing, other suitable signal feature that may be modulated, or any combination of the preceding. Relative phase may refer to the phase difference between the phase of a first signal of a first transmit antenna element and the phase of a second signal of a second transmit antenna element. Relative amplitude may refer to the ratio between the amplitude of the first signal and the amplitude of the second signal. Absolute power may refer to the total power transmitted by modifying communication device 20a.

A signal may be modified by applying a diversity parameter adjustment to the signal. According to one embodiment, a next diversity parameter adjustment $\vec{f}(k+1)$ may be calculated from a current diversity parameter adjustment $\vec{f}(k)$ and a diversity parameter increment adjustment $\Delta \vec{f}(k)$ according to $\vec{f}(k+1) = \vec{f}(k) + \Delta \vec{f}(k)$, where k represents an iteration.

Signal modifier 28 may use feedback information to determine a diversity parameter adjustment for a next window. The feedback information may indicate, for example, whether modifying communication device 20a should increase or reduce transmission power. Feedback information may be obtained from a feedback signal in any suitable manner. According to a first example technique, signal modifier 28 obtains feedback information from a quality indication signal received from feedback communication device 20b. A quality indication signal may refer to a signal that describes a quality of a signal transmitted by modifying communication device 20a as received by feedback communication device 20b. According to a second example technique, signal modifier 28 obtains feedback information from a control signal generated by a baseband subsystem of modifying communication device 20a. A control signal may refer to a signal that that reflects the feedback information and provides instructions to a component of a communication device.

Amplifier stage 34 includes a full power amplifier and a fractional power amplifier. The fractional power amplifier may be selected to amplify a transmit signal using a fractional power. The fractional power amplifier typically consumes less power than the full power amplifier, so the power consumption may be decreased. Examples of amplifier stage 34 are described with reference to FIGS. 2, 3, and 4.

Feedback communication device 20b generates feedback information that reflects the quality of the received modified signals. The quality may be determined in any suitable manner. As an example, a higher signal-to-noise ratio (SNR), or energy per bit to the spectral noise density ($E_b N_0$), may indicate a higher signal quality. In other examples, the quality may be determined using any suitable measurements, for example, receive signal power ($P_R$), bit error rate (BER), frame error rate (FER), other measurement, or any suitable combination of the preceding. Typically, a higher receive signal power, a lower bit error rate, or a lower frame error rate indicate higher signal quality.

Feedback communication device 20b includes a feedback generator 30 that generates feedback information that reflects the quality of the modified signals. The feedback information may include one or more quality indicators. According to one embodiment, a quality indicator may instruct modifying communication device 20a to increase or decrease transmission power. A quality indicator may comprise, for example, a power control bit (PCB) of a code division multiple access (CDMA) power control signal or a transmit power control bit (TPB) of a wideband code division multiple access (WCDMA) power control signal. The quality indicators may be sent to modifying communication device 20a in a quality indication signal. According to another embodiment, a quality indicator may identify specific diversity parameter values that are better than other diversity parameter values. As an example, the quality indicators may indicate that a specific test that tests a specific diversity parameter vector is better than the other tests.

A device of network 10 may include logic, an interface, memory, other component, or any suitable combination of the preceding. "Logic" may refer to hardware, software, other logic, or any suitable combination of the preceding. Certain logic may manage the operation of a device, and may comprise, for example, a processor. "Interface" may refer to logic of a device operable to receive input for the device, send output from the device, perform suitable processing of the input or output or both, or any combination of the preceding, and may comprise one or more ports, conversion software, or both. "Memory" may refer to logic operable to store and facilitate retrieval of information, and may comprise Random Access Memory (RAM), Read Only Memory (ROM), a magnetic drive, a disk drive, a Compact Disk (CD) drive, a Digital Video Disk (DVD) drive, removable media storage, any other suitable data storage medium, or any suitable combination of the preceding.

Modifications, additions, or omissions may be made to communication network 10 without departing from the scope of the invention. Additionally, operations of communication network 10 may be performed using any suitable logic. As used in this document, "each" refers to each member of a set or each member of a subset of a set. A subset of a set may include none, some, or all elements of the set.

FIG. 2 is a block diagram illustrating one embodiment of a transmitter (Tx) output stage 100 that includes an amplifier stage 110 operable to amplify a signal. According to one embodiment, Tx output stage 100 may be used with modifying communication device 20a.

According to the illustrated embodiment, Tx output stage 100 includes power amplifier stage 110 and an antenna 122 coupled as shown. Power amplifier stage 110 receives a transmit signal through an input, amplifies the signal, and sends the amplified signal through an output coupled to antenna 122. Power amplifier stage 110 includes a plurality of power amplifiers 112 and 114 and a plurality of switches 118 coupled as shown.

Power amplifier stage 110 may include any suitable number of power amplifiers, for example, amplifiers 112 and 114. A power amplifier may comprise any suitable amplifier operable to amplify a signal. For example, a power amplifier may comprise a radio frequency (RF) analog signal amplifier. The signal amplifier may be formed of one or more stages and may provide linear or non-linear amplification, for example, logarithmic amplification.

According to one embodiment, power amplifiers 112 and 114 may include one or more full power amplifiers 112 and one or more fractional power amplifiers 114. A full power amplifier 112 may represent a power amplifier that provides full power to amplify signals up to a specification power limit. For example, a power amplifier such as the AWT6135 power amplifier from ANADIGICS, INC., amplifies up to +28 dBm for cdma2000. Full power amplifier 112 may be designed such that its maximum power efficiency coincides with the full power output. Full power may be used at any suitable time, for example, when modifying communication device 20a is far from feedback communication device 20b.

A fractional power amplifier 114 may represent a power amplifier that provides fractional power to amplify signals up to a portion of a specification power limit. Fractional power may refer to any suitable portion, for example, one-half power, one-quarter power, or x/y power for any suitable x and y. Fractional power may be used at any suitable time, for example, during normal operation of modifying communication device 20a. Fractional power amplifier 114 may be designed such that its maximum power efficiency coincides with the fractional power output. The rated power of fractional power amplifier 114 is a fraction of the rated power of full power amplifier 112, so the power consumption of fractional power amplifier 114 is proportionally lower that the power consumption of full power amplifier 112.

According to one embodiment, fractional power amplifiers 114 may include a plurality of fractional power amplifiers 114. Fractional power amplifiers 114 may be placed in parallel, and may have the same or different fractional powers. A fractional power amplifier 114 may be selected by switches 118 controlled by control signals. Fractional power amplifiers 114 may amplify signals using different power levels, which may increase power efficiency.

Switches 118 may represent RF switches that steer signals to amplifier 112, amplifier 114, bypass path, or any suitable combination of the preceding. A switch 118 may have any suitable number m of positions. As an example, switch 118 may have m=n+1 positions to accommodate n amplifiers 112 and 114 and a bypass path. According to the illustrated embodiment, a switch 118 has m=3 positions labeled A, B, and C. The A positions direct a signal to a path that bypasses full power amplifier 112 and fractional power amplifier 114, the B positions direct a signal to fractional power amplifier 114, and the C positions direct the transmit signal to full power amplifier 112.

A control input of switch 118 receives a control signal. The control signal digitally controls the position of switch 118, and may be sent by a controller of modifying communication device 20a, for example, the MSM7500 chipset from QUALCOMM INCORPORATED. The control signal may represent a portion of digital control bus or signals derived from a digital control bus.

Antenna 122 may represent an RF antenna operable to receive, transmit, or both receive and transmit a signal. Antenna 122 may comprise, for example a typical handset antenna, such as a retractable antenna.

Modifications, additions, or omissions may be made to power amplifier stage 110 without departing from the scope of the invention. The components of power amplifier stage 110 may be integrated or separated according to particular needs. For example, the present invention contemplates some or all of amplifiers 112 and 114 and switches 118a-b being provided at a single device, for example, a single integrated circuit. If any of the components of power amplifier stage 110 are separated, the separated components may be coupled using a bus or other suitable link. Moreover, the operations of power amplifier stage 110 may be performed by more, fewer, or other modules. Additionally, operations of power amplifier stage 110 may be performed using any suitable logic.

FIG. 3 is a block diagram illustrating one embodiment of a transmitter (Tx) output stage 200 that includes an amplifier stage 210 operable to amplify a plurality of signals. According to one embodiment, Tx output stage 200 may be used with modifying communication device 20a.

According to the illustrated embodiment, Tx output stage 200 includes power amplifier stage 210 and antennas 222 coupled as shown. Power amplifier stage 210 receives transmit signals $S_1$ and $S_2$ through inputs, amplifies the signals, and sends the amplified signals through an output coupled to antennas 222. Power amplifier stage 210 comprises any suitable number of channels 206. According to the illustrated embodiment, channel 206a amplifies signal $S_1$, and channel 206b amplifies signal $S_2$. Channels 206 comprise any suitable number n of power amplifiers 112 and 114 and a plurality of switches 118 coupled to a plurality of antennas 222 as shown.

According to the illustrated embodiment, channel 206a comprises fractional power amplifier 114a coupled to antenna 222a, and channel 206a comprises fractional power amplifier 114b, full power amplifier 112, and switches 118a-b coupled to antenna 222b.

According to the illustrated embodiment, a switch 118 has m=2 positions, labeled B and C, to accommodate fractional power amplifier 114b and full power amplifier 112. The B positions direct a signal to fractional power amplifier 114. The output of fractional power amplifiers 114 may be maximized by, for example, the setting of their internal gain. The C positions direct a signal to full power amplifier 112. The output of fractional power amplifiers 114 may be minimized by, for example, the setting of their internal gain.

Antennas 222 may represent RF antennas operable to receive, transmit, or both receive and transmit a signal. Antennas 222 may comprise, for example whip, chip, or slot antennas.

Modifications, additions, or omissions may be made to power amplifier stage 210 without departing from the scope of the invention. The components of power amplifier stage 210 may be integrated or separated according to particular needs. For example, the present invention contemplates some or all of amplifiers 112 and 114 and switches 118a-b being provided at a single device, for example, a single integrated circuit. If any of the components of power amplifier stage 210 are separated, the separated components may be coupled using a bus or other suitable link. Moreover, the operations of power amplifier stage 210 may be performed by more, fewer, or other modules. Additionally, operations of power amplifier stage 210 may be performed using any suitable logic.

FIG. 4 is a block diagram illustrating one embodiment of a transmitter (Tx) output stage 300 that includes an amplifier stage 310 operable to amplify a plurality of signals. According to one embodiment, Tx output stage 300 may be used with modifying communication device 20a.

According to the illustrated embodiment, Tx output stage 300 includes power amplifier stage 310 and antennas 222 coupled as shown. Power amplifier stage 310 receives transmit signals $S_1$ and $S_2$ through inputs, amplifies the signals, and sends the amplified signals through an output coupled to antennas 222. Power amplifier stage 210 comprises any suitable number of channels 306. According to the illustrated embodiment, channel 306a amplifies signal $S_1$, and channel 306b amplifies signal $S_2$. Channels 306 comprise any suitable number n of power amplifiers 112 and 114 and a plurality of switches 118 coupled to a plurality of antennas 122 as shown. According to the illustrated embodiment, channel 206a comprises fractional power amplifier 114a and switches 118a-b coupled to antenna 222a, and channel 206a comprises fractional power amplifier 114b, full power amplifier 112, and switches 118c-d coupled to antenna 222b.

According to the illustrated embodiment, a switch 118a-b has m=2 positions, labeled A and C, to accommodate a bypass path and fractional power amplifier 114a. The A positions direct a signal to the bypass path, and the C positions direct a signal to fractional power amplifier 114a. A switch 118c-d has m=3 positions, labeled D, E, and F, to accommodate a bypass path, fractional power amplifier 114b, and full power amplifier 112. The A positions direct a signal to the bypass path, the B positions direct a signal to fractional power amplifier 114b, and the C positions direct a signal to full power amplifier 112.

Antennas 222 may represent RF antennas operable to receive, transmit, or both receive and transmit a signal. Antennas 222 may comprise, for example whip, chip, or slot antennas.

Modifications, additions, or omissions may be made to power amplifier stage 310 without departing from the scope of the invention. The components of power amplifier stage 310 may be integrated or separated according to particular needs. For example, the present invention contemplates some or all of amplifiers 112 and 114 and switches 118a-b being provided using a single device, for example, a single integrated circuit. If any of the components of power amplifier stage 310 are separated, the separated components may be coupled using a bus or other suitable link. Moreover, the operations of power amplifier stage 310 may be performed by more, fewer, or other modules. Additionally, operations of power amplifier stage 310 may be performed using any suitable logic.

Figure 5:
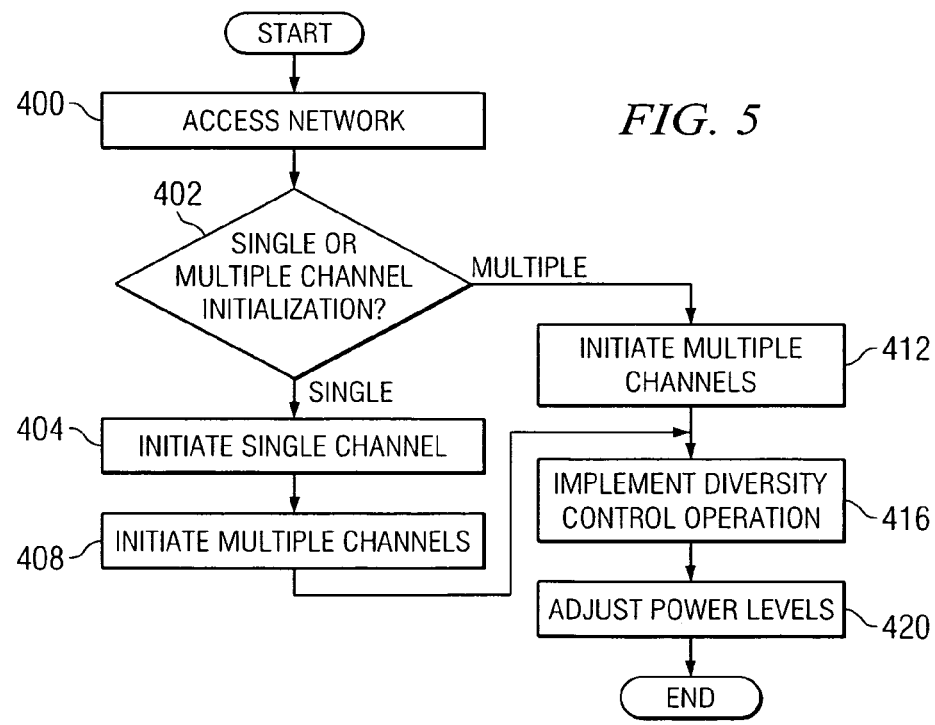
FIG. 5 is a flowchart illustrating one embodiment of a method for amplifying a signal that may be used by the amplifier stage of the modifying communication device of FIG. 1.

FIG. 5 is a flowchart illustrating one embodiment of a method for amplifying a signal that may be used by amplifier stage 34 of modifying communication device 20a of FIG. 1.

The method begins at step 400, where a network comprising feedback communication device 20b is accessed by modifying communication device 20a. Single or multiple channel initialization may be performed at step 402. During initialization, any suitable combination of one or more amplifiers 112 and 114 may be utilized to amplify one or more transmit signals for transmission by one or more antennas 122 and 222. In single channel initialization, a single antenna may transmit signals. In multiple channel initialization, multiple antennas may transmit signals, which may provide for diversity control.

If single channel initialization is to be performed at step 402, the method proceeds to step 404, where a single channel is initialized. The initialization may be performed in any suitable manner. For example, a first signal may be directed to a bypass path, and a second signal may be directed to a full power amplifier 112 to yield full transmit power. Multiple channels are initiated at step 412. The multiple channels may be initiated in any suitable manner. As an example, a first signal may be directed to a first fractional power amplifier 114, and a second signal may be directed to a second fractional power amplifier 114 to perform a diversity control operation. The method then proceeds to step 416.

If multiple channel initialization is to be performed at step 402, the method proceeds to step 412, where multiple channels are initialized. The initialization may be performed in any suitable manner, for example, as described with reference to step 408. The method then proceeds to step 416.

A diversity control operation is implemented at step 416. Any suitable diversity control operation may be used. Power levels are adjusted at step 424. Power levels may be adjusted in response to any suitable situation. As an example, the power may be decreased if modifying communication device 20a moves closer to feedback communication device 20b. Power levels may be adjusted in any suitable manner, for example, in a manner described with reference to steps 404 or 412. After adjusting the power levels, the method terminates.

Modifications, additions, or omissions may be made to the method without departing from the scope of the invention. The method may include more, fewer, or other steps. Additionally, steps may be performed in any suitable order without departing from the scope of the invention.

Certain embodiments of the invention may provide one or more technical advantages. A technical advantage of one embodiment may be that a transmit amplifier stage includes a full power amplifier and a fractional power amplifier. The fractional power amplifier may be selected to amplify a transmit signal using a fractional power. The fractional power amplifier typically consumes less power than the full power amplifier, so the power consumption may be decreased.

Another technical advantage of one embodiment may be that the amplifier stage may be used to amplify multiple transmit signals to be transmitted from multiple antennas. The multiple transmit signals may be used to perform a diversity control operation, which may compensate for multipath fading and suppress interference signals.

While this disclosure has been described in terms of certain embodiments and generally associated methods, alterations and permutations of the embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A mobile wireless communication device comprising:
   a signal modifier in said mobile wireless communication device to receive an input signal and produce a first transmit signal differing by a diversity parameter adjustment from a second transmit signal, wherein said diversity parameter is selected from the group consisting of relative phase and relative amplitude between said first and second transmit signals; and
   a transmit amplifier stage in said mobile wireless communication device operable to amplify said first and second transmit signals, comprising:
      a first channel comprising at least one first power amplifier operable to provide power to amplify the first transmit signal for transmission by a first antenna at a first fractional power, wherein a substantially maximum efficiency of the first power amplifier substantially coincides with the first fractional power, the first fractional power being a first fraction of a specification power limit of the wireless device; and
      a second channel comprising at least one second power amplifier operable to amplify the second transmit signal for transmission by a second antenna at a second fractional power, wherein a substantially maximum efficiency of the second power amplifier substantially coincides with the second fractional power, the second fractional power being a second fraction of the specification power limit of the wireless device,
   wherein said signal modifier is further to produce said diversity parameter adjustment based on a signal quality indicator received from a receiver of said first and second transmit signals, and wherein said signal quality indicator indicates a quality of the first and second transmit signals combined as received at said receiver.

2. The wireless communication device of claim 1, wherein the second channel comprises:
   a plurality of second power amplifiers, each providing a different power amplification to said second transmit signal; and
   one or more switches, each of which having a plurality of positions, a position operable to direct the second transmit signal to a selected power amplifier of the plurality of second power amplifiers.

3. The transmit amplifier stage of claim 1, further comprising at least one of:
   a first bypass path operable to selectively bypass the first power amplifier; and
   a second bypass path operable to selectively bypass the at least one second power amplifier.

4. The wireless communication device of claim 2, wherein said plurality of second power amplifiers includes said second power amplifier operable to amplify the second transmit signal at said second fractional power, and at least one full power amplifier operable to amplify the second transmit signal at said specification power limit of the wireless device.

5. The wireless communication device of claim 1, wherein at least one of said first and second channels consists essentially of said respective fractional power amplifier.

6. The wireless communication device of claim 1, wherein at least one of said first and second fractional powers is less than half of said specification power limit of the wireless device.

7. The wireless communication device of claim 1, wherein said first and second fractional powers are less than half of said specification power limit of the wireless device.

8. The wireless communication device of claim 1, wherein at least one of said first and second fractional powers is a quarter of said specification power limit of the wireless device.

9. The wireless communication device of claim 1, wherein said first and second fractional powers are a quarter of said specification power limit of the wireless device.

10. The wireless communication device of claim 1, wherein said first and second channels are operable to provide said respective first and second transmit signals for simultaneous transmission over the same frequency.

11. The mobile wireless communication device of claim 1, wherein the first fractional power is one substantially one half of the specification power limit of the wireless device.

12. The mobile wireless communication device of claim 11, wherein the second fractional power is one substantially one half of the specification power limit of the wireless device.

13. The mobile wireless communication device of claim 11, wherein the second fractional power is one substantially one quarter of the specification power limit of the wireless device.

14. A method for transmission of a signal by a mobile wireless communication device, comprising:
   receiving an input signal for transmission;
   producing based on said input signal a first transmit signal differing by a diversity parameter adjustment from a second transmit signal, wherein said diversity parameter is selected from the group consisting of relative phase and relative amplitude between said first and second transmit signals;
   amplifying by a first fractional power the first transmit signal for transmission by a first antenna, the first fractional power being a first fraction of a specification power limit of the mobile wireless communication device, said amplification of the first transmit signal performed by a first fractional power amplifier having a substantially maximum efficiency that substantially coincides with the first fractional power;
   amplifying by a second fractional power the second transmit signal for transmission by a second antenna, the second fractional power being a second fraction of the specification power limit of the mobile wireless communication device, said amplification of the second transmit signal performed by a second fractional power amplifier having a substantially maximum efficiency that substantially coincides with the second fractional power;
   transmitting by said mobile wireless communication device said amplified first and second transmit signals, thereby producing transmission of said input signal by said full transmission power;
   receiving a signal quality indicator from a receiver of said first and second transmit signals; and producing said diversity parameter adjustment based on said signal quality indicator, wherein said signal quality indicator indicates a quality of the first and second transmit signals combined as received at said receiver.

15. The method of claim 14, wherein amplifying the second transmit signal comprises:
receiving one or more control signals comprising an instruction for amplifying the second transmit signal;
selecting a position of a plurality of positions of at least one switch in accordance with the control signal, a position operable to direct the second transmit signal to a corresponding second power amplifier of a plurality of second power amplifiers, the plurality of second power amplifiers including a full power amplifier operable to provide the specification power limit of the wireless device, and a fractional power amplifier operable to provide said second fractional power; and
amplifying the second transmit signal using the selected second power amplifier corresponding to the selected position.

16. The method of claim 14, wherein at least one of said first and second fractional powers is less than half of the specification power limit.

17. The method of claim 14, wherein said first and second fractional powers are less than half of the specification power limit.

18. The method of claim 14, wherein at least one of said first and second fractional powers is one quarter of the specification power limit.

19. The method of claim 14, wherein said first and second fractional powers are one quarter of the specification power limit.

20. The method of claim 14, wherein transmitting said amplified first and second transmit signals comprises simultaneously transmitting said amplified first and second transmit signals over said first and second respective antennas over the same frequency.

21. The method of claim 14, wherein amplifying at least one of the first and second transmit signal consists essentially of amplifying said transmit signal using said respective fractional power amplifier.

22. The method of claim 14, wherein said first fractional power is substantially one half of the specification power limit of the wireless device.

23. The method of claim 22, wherein said second fractional power is substantially one half of the specification power limit of the wireless device.

24. The method of claim 22, wherein said second fractional power is substantially one quarter of the specification power limit of the wireless device.

25. A mobile wireless communication device comprising:
a signal modifier to receive an input signal and produce a first transmit signal differing by a diversity parameter adjustment from a second transmit signal; and
a transmit amplifier stage operable to amplify said first and second transmit signals, comprising:
a first channel comprising at least one first power amplifier operable to provide power to amplify the first transmit signal for transmission by a first antenna at a first fractional power, the first fractional power being a first fraction of a specification power limit of the wireless device, wherein a substantially maximum efficiency of the first power amplifier substantially coincides with the first fractional power; and
a second channel comprising at least one second power amplifier operable to amplify the second transmit signal for transmission by a second antenna at a second fractional power, the second fractional power being a second fraction of the specification power limit of the wireless device, wherein a substantially maximum efficiency of the second power amplifier substantially coincides with the second fractional power,
wherein said signal modifier is further to produce said diversity parameter adjustment based on a signal quality indicator received from a receiver of said first and second transmit signals.

26. The wireless communication device of claim 25, wherein said signal quality indicator indicates a quality of the first and second transmit signals combined as received at said receiver.

27. The wireless communication device of claim 25, wherein at least one of said first and second channels consists essentially of said respective fractional power amplifier.

28. The wireless communication device of claim 25, wherein at least one of said first and second fractional powers is less than half of said specification power limit of the wireless device.

29. The wireless communication device of claim 25, wherein at least one of said first and second fractional powers is a quarter of said specification power limit of the wireless device.

30. The wireless communication device of claim 25, wherein said first and second channels are operable to provide said respective first and second transmit signals for simultaneous transmission over the same frequency.

31. The wireless communication device of claim 25, wherein said first fractional power is substantially one half of said specification power limit of the wireless device.

32. The wireless communication device of claim 31, wherein said second fractional power is substantially one half of said specification power limit of the wireless device.

33. The wireless communication device of claim 31, wherein said second fractional power is substantially one quarter of said specification power limit of the wireless device.

34. A method for transmission of a signal by a mobile wireless communication device, comprising:
receiving an input signal for transmission;
producing based on said input signal a first transmit signal differing by a diversity parameter from a second transmit signal;
amplifying by a first fractional power the first transmit signal for transmission by a first antenna, the first fractional power being a first fraction of a specification power limit of the wireless device, said amplification of the first transmit signal performed by a first fractional power amplifier having a substantially maximum efficiency that substantially coincides with the first fractional power;
amplifying by a second fractional power the second transmit signal for transmission by a second antenna, the second fractional power being a second fraction of the specification power limit of the wireless device, said amplification of the second transmit signal performed by a second fractional power amplifier having a substantially maximum efficiency that substantially coincides with the second fractional power;
transmitting said amplified first and second transmit signals, thereby producing transmission of said input signal by said full transmission power;
receiving a signal quality indicator from a receiver of said first and second transmit signals; and
adjusting said diversity parameter based on said signal quality indicator.

35. The method of claim 34, wherein said signal quality indicator indicates a quality of the first and second transmit signals combined as received at said receiver.

36. The method of claim 35, wherein at least one of said first and second fractional powers is less than half of the specification power limit of the wireless device.

37. The method of claim 35, wherein at least one of said first and second fractional powers is one quarter of the specification power limit of the wireless device.

38. The method of claim 35, wherein transmitting said amplified first and second transmit signals comprises simultaneously transmitting said amplified first and second transmit signals over said first and second respective antennas over the same frequency.

39. The method of claim 35, wherein said first fractional power is substantially one half of the specification power limit of the wireless device.

40. The method of claim 39, wherein said second fractional power is substantially one half of the specification power limit of the wireless device.

41. The method of claim 39, wherein said second fractional power is substantially one quarter of the specification power limit of the wireless device.

* * * * *